United States Patent
Yamamoto

(10) Patent No.: US 7,807,741 B2
(45) Date of Patent: Oct. 5, 2010

(54) COATING LIQUID, FILM PRODUCTION METHOD, PRODUCTION METHOD OF FUNCTIONAL DEVICE, AND FUNCTIONAL DEVICE

(75) Inventor: Emi Yamamoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 729 days.

(21) Appl. No.: 11/570,260

(22) PCT Filed: Jun. 13, 2005

(86) PCT No.: PCT/JP2005/010805

§ 371 (c)(1),
(2), (4) Date: Dec. 8, 2006

(87) PCT Pub. No.: WO2005/123856

PCT Pub. Date: Dec. 29, 2005

(65) Prior Publication Data

US 2008/0038488 A1 Feb. 14, 2008

(30) Foreign Application Priority Data

Jun. 17, 2004 (JP) ............................. 2004-179773

(51) Int. Cl.
*C08K 5/375* (2006.01)
*C08K 5/06* (2006.01)
*C08K 5/07* (2006.01)

(52) U.S. Cl. ....................... 524/370; 524/375; 524/281; 585/25

(58) Field of Classification Search .................. 585/25; 524/281, 370, 375

See application file for complete search history.

(56) References Cited

U.S. PATENT DOCUMENTS 5,246,647 A * 9/1993 Beck et al. .................... 264/41

(Continued)

FOREIGN PATENT DOCUMENTS

JP 2000-100572 A 4/2000

(Continued)

OTHER PUBLICATIONS

Official communication issued in the corresponding international application No. PCT/JP2005/010805, mailed on Dec. 20, 2006.
All References Considered Except Where Lined Through. /V.N./.

*Primary Examiner*—David Wu
*Assistant Examiner*—Vu A Nguyen
(74) *Attorney, Agent, or Firm*—Keating & Bennett, LLP

(57) ABSTRACT

The present invention provides a coating liquid which is excellent in stabilities and capable of being stably ejected by an ejection equipment and suppressing variation in film thickness inside a film or between films, in application for various uses, a film production method, a production method of a functional device, and a functional device, using the coating liquid. The present invention is a coating liquid comprising a mixed solvent and a functional material, wherein the mixed solvent comprises a first solvent constituted by a compound having two or more aromatic rings such as diphenyl sulfide, diphenylmethane, diphenyl ether, and a symmetric structure and another solvent constituted by a compound having an aromatic ring such as xylene, and a proportion by volume of the another solvent is 90% or less in the mixed solvent.

12 Claims, 1 Drawing Sheet

Embodiment 1

U.S. PATENT DOCUMENTS

| | | |
|---|---|---|
| 6,720,029 B2 | 4/2004 | Fujita et al. |
| 6,787,063 B2 | 9/2004 | Endo et al. |
| 6,825,061 B2 | 11/2004 | Hokari et al. |
| 6,828,312 B2 | 12/2004 | Jiao et al. |
| 6,878,312 B1 | 4/2005 | Kanbe et al. |
| 2002/0197392 A1 | 12/2002 | Endo et al. |
| 2003/0042472 A1 | 3/2003 | Fujita et al. |
| 2003/0127977 A1* | 7/2003 | Bae et al. .................... 313/504 |
| 2004/0099882 A1 | 5/2004 | Hokari et al. |
| 2004/0195551 A1 | 10/2004 | Endo et al. |
| 2005/0048320 A1 | 3/2005 | Kobayashi |
| 2005/0153058 A1 | 7/2005 | Tachikawa et al. |
| 2005/0156148 A1 | 7/2005 | Kanbe et al. |

FOREIGN PATENT DOCUMENTS

| | | | |
|---|---|---|---|
| JP | 2001-52861 A | | 2/2001 |
| JP | 2001-230074 A | | 8/2001 |
| JP | 2001-284047 A | | 10/2001 |
| JP | 2001-288416 A | | 10/2001 |
| JP | 2001-311023 A | | 11/2001 |
| JP | 2002-371196 A | | 12/2002 |
| JP | 2003-45656 A | | 2/2003 |
| JP | 2003-229256 | * | 8/2003 |
| JP | 2003-229256 A | | 8/2003 |
| JP | 2003-332051 A | | 11/2003 |
| JP | 2004-26894 A | | 1/2004 |
| JP | 2004-39561 A | | 2/2004 |
| JP | 2004-55367 A | | 2/2004 |
| JP | 2004-165136 A | | 6/2004 |
| WO | 00/59267 A1 | | 10/2000 |
| WO | 03/096754 A1 | | 11/2003 |

* cited by examiner

Embodiment 1

Comparative Embodiment 2

COATING LIQUID, FILM PRODUCTION METHOD, PRODUCTION METHOD OF FUNCTIONAL DEVICE, AND FUNCTIONAL DEVICE

BACKGROUND OF THE INVENTION

1. Field of the Invention

The present invention relates to a coating liquid, a film production method, a production method of a functional device, a functional device, an organic electroluminescent device, an organic electroluminescent display device, a color filter substrate, a liquid crystal display device, and a wiring substrate, using the coating liquid. More specifically, the present invention relates to a coating liquid preferable for production of a functional film using an ink jet equipment, a film production method, a production method of a functional device, a functional device, an organic electroluminescent device, an organic electroluminescent display device, a color filter substrate, a liquid crystal display device, and a wiring substrate, using the coating liquid.

2. Description of the Related Art

Film-forming techniques have been widely used for production of displays and the like, including formation of semiconductor layers. Particularly, a film-forming technique using an ink jet equipment (ink jet method) has been employed for production of functional films, such as an organic layer of an organic electroluminescent (EL) display device, a color filter layer of a color filter substrate, and a wiring pattern of a metal wiring substrate. According to the ink jet method, the thickness of the film can be easily adjusted, and a photolithography method and the like is not performed, which is different from a film-forming technique of a spin coat method and the like. Therefore, the functional films can be easily produced at low cost.

A coating liquid used in the ink jet method generally contains a functional material and a solvent. In production of functional films by the ink jet method, if the solvent vaporizes at a head part during ejection of the coating liquid and the functional material and the like is deposited, ejection defects such as irregular arrangement on the substrate of the coating liquid or variation in ejection amount are caused. Therefore, selection of the solvent has been an important problem. Particularly in production of current high-definition displays, the amount of the coating liquid ejected from the head part in one ejection is as small as 10 pl or less in production of the functional film. Therefore, the head part is designed to have a small nozzle diameter. Therefore, ejection defects caused by clogging at the head part are easily generated if the solvent vaporizes and the functional material and the like is deposited.

With respect to reduction in the ejection defects, a composition containing a solvent containing at least one heterocyclic compound having one or more substituent groups and containing an oxygen atom as a constituent atom is disclosed as a coating liquid used in a conventional ink jet method. As this heterocyclic compound, particularly compounds containing a furan ring, an oxazole ring and the like, are disclosed (for example, referring to Japanese Kokai Publication No. 2002-371196 (pages 1 to 4). However, these heterocyclic compounds have room for improvement in stability because such compounds easily generate ring-opening by external stimuli such as heat and light, or easily react with the functional material and the like. In addition, difference in drying environment on the substrate after ejection easily causes difference in film thickness between both edges and the central part of the film, and also causes variation in film thickness between the films. Therefore, there is also room for improvement in order to reduce such problems.

With respect to reduction in ejection defects and variation in film thickness, conventionally disclosed is composition of a coating liquid for forming an organic layer, which contains a solvent containing at least one low-volatile liquid solvent having a vapor pressure of 10 mm Hg or less at 20° C. and a boiling point equal to or lower than a transformation temperature of an organic material or a conversion temperature of a precursor, or a composition containing a solvent containing at least one benzene derivative containing one or more substituent group, in which the total number of the carbon in the substituent is 3 or more (for example, referring to Japanese Kokai Publication No. 2001-52861 (pages 1 to 3) and International Publication WO 00/59267 (pages 1 and 39)). In addition, a production method of an organic EL device using an ink composition for organic EL devices, containing a high boiling point solvent with a boiling point of 200° C. or more (for example, referring to Japanese Kokai Publication No. 2003-229256 (pages 1 and 2)).

SUMMARY OF THE INVENTION

The present invention has been made in view of the above-mentioned state of the art. The present invention has an object to provide: a coating liquid which is excellent in stabilities and coating properties and capable of suppressing variation in film thickness inside a film or between films, in application for various uses; a film production method; a production method of a functional device; a functional device; an organic electroluminescent device; an organic electroluminescent display device; a color filter substrate; a liquid crystal display device; and a wiring substrate, using the coating liquid.

The present inventors have made various investigations on coating liquids containing a functional material and a solvent. The inventors noted stabilities of the solvent to external stimuli such as heat and light, the functional material, and the like. The inventors found that if the solvent of the coating liquid is a mixed solvent containing a first solvent constituted by a compound having two or more aromatic rings and a symmetric structure, and another solvent, stabilities of the coating liquid can be improved. Further, the inventors found that if the proportion by volume of the another solvent is 5 to 90% in the mixed solvent, coating properties of the coating liquid can be improved and variation in film thickness inside the film and between the films can be effectively reduced. Thereby, the above-mentioned problems have been solved, leading to completion of the present invention.

That is, the present invention is a coating liquid comprising a mixed solvent and a functional material, wherein the mixed solvent comprises: a first solvent constituted by a compound having two or more aromatic rings and a symmetric structure; and another solvent, and a proportion by volume of the another solvent is 90% or less in the mixed solvent. The present invention is described in more detail below.

The coating liquid of the present invention contains a mixed solvent and a functional material. The coating liquid means a liquid which can be used for forming a film by coating. The mixed solvent means a solvent constituted by two or more components, and a mixed solvent in which the functional material is dissolved or dispersed is preferable. Further, the functional material means a material exhibiting functions by some stimuli, using electrical, chemical, optical, mechanical properties and the like of the material.

Examples of such a functional material include light-emitting materials such as organic EL materials, electrically conductive materials such as metallic wiring materials, and coloring materials such as color filter materials.

The functional material contained in the coating liquid maybe one or two or more species. The coating liquid of the present invention may or may not contain other components as long as it essentially contains the mixed solvent and the functional material, and it is not especially limited. Additives for adjusting the physical properties to those suitable for application by an ink jet equipment may be mentioned as other components which can be contained in the coating liquid of the present invention. For example, dispersants for the functional material, surfactants and the like may be mentioned. An embodiment in which the coating liquid is constituted by only the mixed solvent and the functional material may be mentioned as a preferable embodiment of the coating liquid of the present invention.

The above-mentioned mixed solvent contains a first solvent constituted by a compound having two or more aromatic rings and a symmetric structure and another solvent. That is, in the present invention, the first solvent is a component constituted by a compound having two or more aromatic rings and a symmetric structure, in the mixed solvent, and the another solvent is constituted by a compound other than the compound constituting the first solvent, in the mixed solvent. The terms "or more" and "or less" used in this description each mean that the value mentioned is included. Each of the compounds constituting the first solvent and the another solvent be one or two or more species. It is preferable that the first solvent and the another solvent are homogeneously mixed. Examples of the aromatic ring of the compound constituting the first solvent include (1) benzene rings (2) condensed benzene rings such as naphthalene ring and pyrene ring, (3) non-benzene aromatic rings such as tropylium ring and cyclopropenium ring, and (4) heterocyclic aromatic rings such as pyridine ring and pyrrole ring. Examples of the symmetric structure include line (axis) symmetric structures, point symmetric structures, and plane symmetry structures.

In the coating liquid of the present invention, the compound constituting the first solvent has the above-mentioned structure, and therefore the functional materials which can be used are not especially limited. Particularly if a nonpolar or weakly polar functional material is used, the coating liquid can be preferably used as a coating liquid for forming functional films, without deterioration of the functions of the functional material. In addition, the coating liquid of the present invention can be preferably used as a coating liquid for forming functional films under various conditions because the solvent has high stabilities to external stimuli such as heat and light or functional material and the like.

The proportion by volume of the above-mentioned another solvent is (more than 0) 90% or less in the mixed solvent. In the present description, "the proportion by volume of the another solvent" means that a proportion of the volume of the another solvent to sum of the volume of the first solvent and the volume of the another solvent in the state where the solvents are not mixed under the conditions of $1.0 \times 10^5$ Pa (atmospheric pressure) and 25° C. That is, if the first solvent and the another solvent are mixed, the sum of the volumes before mixing (at unmixed state) is different from the total volume after mixing (at mixed state) in some cases. Therefore, in the present invention, if the proportion by the volume before mixing is different from that after mixing, the proportion by volume is calculated based on the unmixed state. If the proportion by volume of the another solvent is more than 90% in the mixed solvent, the functional effects of the present invention may be insufficiently exhibited.

Preferable embodiments of the coating liquid of the present invention are mentioned below.

It is preferable that the proportion by volume of the another solvent is 5% or more in the mixed solvent. If the mixed solvent is less than 5%, there is a possibility that the physical property value of the coating liquid can not be adjusted to a value suitable for film production. In the present invention, the proportion by volume of the another solvent is varied within 5 to 90%, the physical property value of the coating liquid can be adjusted to a value suitable for film production according to application method, and therefore stable ejection can be performed with an ejection equipment under various conditions, regardless of the kind of the functional material. Therefore, the functional film is easily designed.

It is preferable that the proportion by volume of the another solvent is 30 to 60% in the mixed solvent. As a result, the flatness of the liquid droplet after ejection is improved and variation in film thickness inside the film and between the films can be effectively reduced. Therefore, if a luminescent layer in an organic EL device is formed, for example, an organic EL device with excellent display quality, which has small variation in film thickness inside a pixel and between pixels, can be produced.

It is preferable that the compound constituting the first solvent has a structure with a two-fold rotation axis. That is, the compound constituting the first solvent preferably has a structure with a two-fold rotation axis (C2 symmetric structure) as a symmetric element. It is preferable that the compound constituting the first solvent has a symmetric structure to the central axis of the molecular structure. If the compound constituting the first solvent has such a symmetric structure, the stabilities of the solvent to external stimuli such as heat and light or the functional material and the like can be more efficiently improved. Therefore, the coating liquid of the present invention can be used as a coating liquid for forming functional films under more various conditions.

It is preferable that the first solvent is a liquid at $1.0 \times 10^5$ Pa and 25° C., and has a boiling point of 250° C. or more at $1.0 \times 10^5$ Pa. If the first solvent is a component constituted by one compound, the above-mentioned properties of the first solvent are those of the one compound. If the first solvent is a component constituted by two or more compounds, the properties are those exhibited when the two or more compounds are mixed at a ratio contained in the mixed solvent. If the first solvent has the above-mentioned properties, the volatility is sufficiently reduced. Therefore, deposition of the functional material and the like is suppressed, which can more effectively reduce ejection defects such as reduction in accuracy of arrangement of the coating liquid due to clogging at the coating liquid outlet of the coating equipment, or variation in ejection amount. In addition, after the coating liquid is ejected, the first solvent as a high boiling point solvent does not vaporize immediately and easily remains on the substrate. Therefore, the coating liquid-dried process can be easily controlled, and phenomenon in which difference in film thickness is generated between both edges and the central part in the film due to difference in drying environment on the substrate is prevented and thereby variation in film thickness inside the film can be more effectively reduced. In addition, variation in film thickness on the whole of the film, that is, between the films can be more effectively reduced.

It is preferable that the first solvent is constituted by at least one compound selected from the group consisting of diphenyl sulfide, diphenylmethane, diphenyl ether, diphenylethylene, dibenzyl ether, and diphenylacetone. Among them, diphenyl sulfide, diphenylmethane, and diphenyl ether are preferably used. Such compounds are liquids at $1.0 \times 10^5$ Pa and 25° C.

and each have a high boiling point. Therefore, the ejection defects caused by deposition of the functional material and the like or variation in film thickness can be effectively reduced. These compounds have symmetric structures, and therefore the stabilities of the solvent to external stimuli such as heat or light or the functional material and the like are high. Therefore, the coating liquid of the present invention can be used as a coating liquid for forming functional films under more various conditions. The structural formulae of these compounds are shown in the following formulae (1) to (6). The following formula (1) represents diphenyl sulfide; the following formula (2) represents diphenylmethane; the following formula (3) represents diphenyl ether; the following formula (4) represents diphenylethylene; the following formula (5) represents dibenzyl ether; the following formula (6) represents diphenyl acetone.

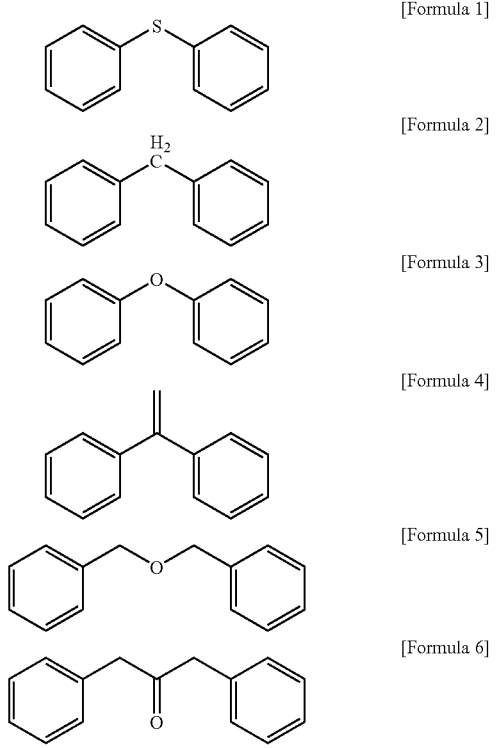

[Formula 1]
[Formula 2]
[Formula 3]
[Formula 4]
[Formula 5]
[Formula 6]

It is preferable that the another solvent contains a compound having an aromatic ring. The compound having an aromatic ring, which is contained in the another solvent, is not especially limited as long as it is a compound other than the compound constituting the first solvent. Examples thereof include benzene, toluene, m-xylene, o-xylene, p-xylene, 1,3,5-trimethylbenzene, 1,2,4-trimethylbenzene, 1,2,3,4-tetramethylbenzene, 1,2,3,4-tetrahydronaphthalene, cymene, durene, cumene, decalin, and cyclohexylbenzene. The number of the aromatic ring of the compound having an aromatic ring, which is contained in the another solvent, may be one or two or more. The compound having an aromatic ring, which is contained in the another solvent, may be one species or two or more species. If the another solvent contains a compound having an aromatic ring, the compatibility of the another solvent with the first solvent is higher. Therefore, deposition of the functional material after the coating liquid preparation or clogging during the ejection due to volatilization of the solvent in the ejection equipment can be more effectively reduced. Therefore, the coating liquid permits stable ejection.

It is preferable that the another solvent has a boiling point of 130° C. or more and less than the boiling point of the first solvent at $1.0 \times 10^5$ Pa. If the another solvent is a component constituted by one compound, the above-mentioned properties of the another solvent are those of the one compound. If the another solvent is a component constituted by two or more compounds, the properties are those exhibited when the two or more compounds are mixed at a ratio contained in the mixed solvent. If the another solvent has a boiling point of less than 130° C. at $1.0 \times 10^5$ Pa, deposition of the functional material and the like due to volatilization of the another solvent may causes ejection defects or variation in film thickness in production of a film. If the another solvent has a boiling point higher than that of the first solvent, not only the first solvent which is a high boiling point solvent but also the another solvent remains on the substrate without volatilization. Therefore, the drying process of the coating liquid may be difficult to control. If the another solvent has a boiling point of 130° C. or more and less than a boiling point of the first solvent at $1.0 \times 10^5$ Pa, unevenness in film thickness or phase separation of the coating liquid content, which is generated in the drying process after ejection of the coating liquid, can be more effectively reduced and a uniform film which hardly has unevenness in film thickness inside the film and between the films can be formed.

The present invention is also a film production method comprising a step of forming a film by performing pattern application of the coating liquid. The "pattern application of the coating liquid" means that the coating liquid is applied in a predetermined pattern shape. It is preferable that the pattern application is performed on depressions and the like having a predetermined pattern shape, which is formed on the substrate and to which the coating liquid is applied. In the step of forming a film, the pattern application is performed and then, if necessary, treatment of removing part of or all of the mixed solvent and the like from the coating liquid applied is performed. The film production method of the present invention can be preferably used for forming functional films such as an organic light-emitting layer, a metal wiring film, and a color filter layer. In the film production method of the present invention, the coating liquid of the present invention is used. Therefore, the method can be applied in various applications and can form a uniform film which hardly has unevenness inside the film and between the films.

The film production method of the present invention may or may not include other steps as long as it essentially includes the film formation step, and it is not especially limited.

It is preferable that the pattern application of the coating liquid is performed using an ejection equipment. The ejection equipment is not especially limited as long as it is a equipment of applying the coating liquid on the part where the film is formed by ejecting the coating liquid. The pattern application of the coating liquid is performed continuously using the ejection equipment, and thereby, a patterned film can be produced easily at low cost. It is preferable that the ejection equipment is an ink jet equipment. Use of the ink jet equipment makes it possible to apply the coating liquid in a fine pattern shape with accuracy, and therefore, a finely patterned film can be produced easily at low cost.

It is preferable that an amount ejected in one ejection from a nozzle head of the ejection equipment is more than 0 and 10 pl or less. That is, it is preferable that one droplet of the liquid droplet of the coating liquid ejected from the ejection equipment has a volume of 10 pl or less. As a result, the functional effects of the present invention such as reduction in variation in film thickness can be sufficiently exhibited, and in addition, a high-definitely patterned film can be produced.

It is preferable that the film production method comprising a step of forming a film by applying the coating liquid and treating the coating liquid by air drying, heating, pressurization, reduced pressure, or a combination thereof. If such treatment is performed according to properties of the mixed solvent, a uniform and homogeneous film can be produced while preventing unevenness in film thickness or phase separation of the solute.

The present invention is also a production method of a functional device, comprising a step of forming a film by the film production method, and also a functional device formed using the coating liquid. According to the production method of a functional device of the present invention and the functional device of the present invention, a functional device having no unevenness and uniform properties on the whole of the device can be obtained. The production method of the functional device of the present invention may or may not include other steps as long as it essentially includes the step of forming a film by the film production method of the present invention, and it is not especially limited.

The above-mentioned functional device is not especially limited, and an organic EL device, a color filter, a metal wiring pattern, and the like may be mentioned, for example. Accordingly, the present invention also includes (1) an organic electroluminescent device in which an organic layer is formed using the coating liquid of the present invention, (2) a color filter substrate in which a color filter layer is formed using the coating liquid of the present invention, (3) a wiring substrate on which a wiring pattern is formed using the coating liquid of the present invention, (4) an organic electroluminescent display device in which a wiring pattern is formed using the coating liquid of the present invention. A luminescent layer, a positive-hole injecting layer, a positive-hole transporting layer, may be mentioned as the above-mentioned organic layer. The present invention also relates to an organic electroluminescent display device including the above-mentioned (1) organic electroluminescent device, a liquid crystal display device including the above-mentioned (2) color filter substrate, and a liquid crystal display device including the above-mentioned (3) wiring substrate.

The coating liquid of the present invention has the above-mentioned configuration. Therefore, the solvent is excellent in stabilities to external stimuli such as heat and light or functional materials and the like. In addition, the coating liquid is excellent in coating properties, and can suppress variation in film thickness inside the film and between the films, and therefore can be preferably used in formation of functional films.

DETAILED DESCRIPTION OF PREFERRED EMBODIMENTS

Figure 1:
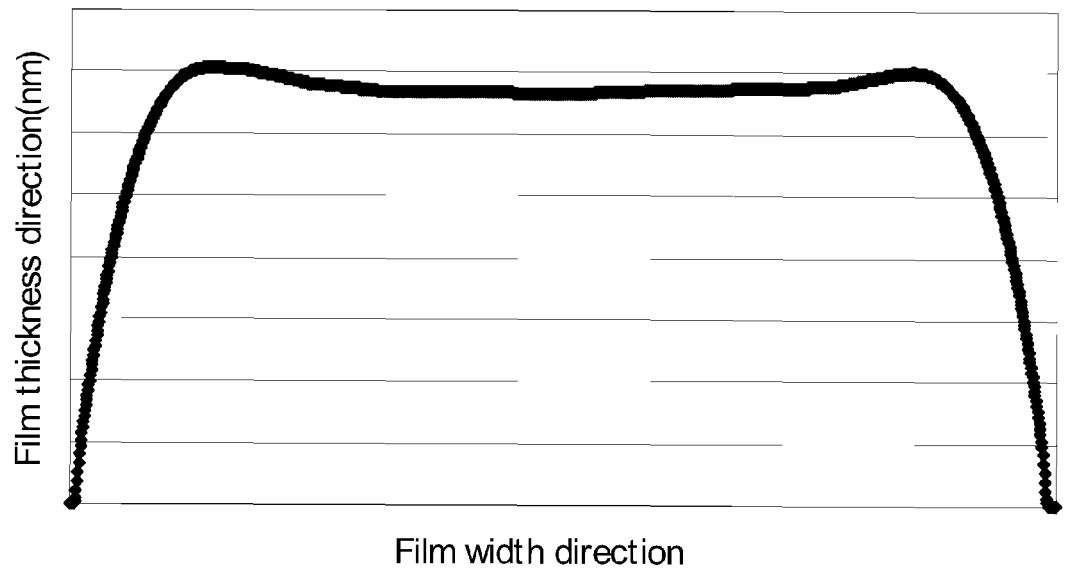
FIG. 1 is a drawing showing a representative example of a film thickness profile of the film obtained using the head in which the amount ejected in one ejection is 8 pl in Embodiment 1.

The present invention is mentioned in more detail below with reference to the following Embodiments, but the present invention is not limited to only these Embodiments. That is, the present invention can be applied not only in production of a bottom emission type organic EL display device mentioned in the following Embodiments, but also in production of a color filter substrate or patterning of a metal wiring, using an ink jet equipment. The ratio by volume of the mixed solvent in the following Embodiments is measured at $1.0 \times 10^5$ Pa (atmosphere pressure) and 25° C.

Embodiment 1

A glass substrate with an ITO (Indium Tin Oxide) film with a film thickness of 150 nm was subjected to patterning by a photolithography method to prepare a glass substrate with an ITO transparent stripe electrode. This glass substrate with an ITO transparent stripe electrode was cleaned by wet process cleaning using isopropyl alcohol, acetone, pure water and the like, and dry process cleaning such as UV/ozone treatment and plasma treatment.

Then, a coating liquid for organic EL (coating liquid 1) containing a mixed solvent of diphenylmethane (the first solvent) : m-xylene (the another solvent)=60:40 (ratio by volume before mixing) and PDF (poly(9,9-dioctylfluorene) as an organic luminescent material (the functional material) at a concentration of 7 mg/ml was prepared. This coating liquid 1 was ejected on the glass substrate with the ITO transparent stripe electrode, using an ink jet equipment having a head in which an amount ejected in one ejection was 8 pl or 20 pl. The substrate on which the coating liquid 1 was ejected was dried under reduced pressure at a room temperature (25° C.) for 60 minutes, and then subjected to heat treatment at 200° C. for 60 minutes. As a result, a mixed solvent was evaporated to form a film. Composition of the coating liquid 1 is shown below.

"Composition of the coating liquid 1"

| | |
|---|---|
| Functional material: polydioctylfluorene (PDF) | 700 mg |
| Solvent: diphenylmethane (boiling point 264.5° C.) | 60 ml |
| m-xylene (boiling point 139.3° C.) | 40 ml |

Embodiment 2

A film was formed by performing application in the same manner as in Embodiment 1, except that a coating liquid for organic EL (coating liquid 2) containing, as a mixed solvent, diphenylmethane:m-xylene=70:30 (ratio by volume before mixing) was used. Composition of the coating liquid 2 is shown below.

"Composition of the coating liquid 2"

| | |
|---|---|
| Functional material: polydioctylfluorene (PDF) | 700 mg |
| Solvent: diphenylmethane (boiling point 264.5° C.) | 70 ml |
| m-xylene (boiling point 139.3° C.) | 30 ml |

Embodiment 3

A film was formed by performing application in the same manner as in Embodiment 1, except that a coating liquid for organic EL (coating liquid 3) containing, as a mixed solvent, diphenylmethane: m-xylene=40:60 (ratio by volume before mixing) was used. Composition of the coating liquid 3 is shown below.

"Composition of the coating liquid 3"

| Functional material: polydioctylfluorene (PDF) | 700 mg |
| Solvent: diphenylmethane (boiling point 264.5° C.) | 40 ml |
| m-xylene (boiling point 139.3° C.) | 60 ml |

Comparative Embodiment 1

A film was formed by performing application in the same manner as in Embodiment 1, except that a coating liquid for organic EL (coating liquid 4) containing, as a mixed solvent, diphenylmethane:m-xylene=9:91 (ratio by volume before mixing) was used. Composition of the coating liquid 4 is shown below.

"Composition of the coating liquid 4"

| Functional material: polydioctylfluorene (PDF) | 700 mg |
| Solvent: diphenylmethane (boiling point 264.5° C.) | 9 ml |
| m-xylene (boiling point 139.3° C.) | 91 ml |

Comparative Embodiment 2

A film was formed by performing application in the same manner as in Embodiment 1, except that a coating liquid for organic EL (coating liquid 5) containing, as a mixing solvent, 1,2,3,4-tetrahydronaphthalene (tetralin) :m-xylene=60:40 (ratio by volume before mixing) was used. Composition of the coating liquid 5 was shown below.

"Composition of the coating liquid 5"

| Functional material: polydioctylfluorene (PDF) | 700 mg |
| Solvent: tetralin (boiling point 207.6° C.) | 60 ml |
| m-xylene (boiling point 139.3° C.) | 40 ml |

Reference Embodiment 1

A film was formed by performing application in the same manner as in Embodiment 1, except that a coating liquid for organic EL (coating liquid 6) containing, as a mixed solvent, diphenylmethane:m-xylene=90:10 (ratio by volume before mixing) was used. Composition of the coating liquid 6 was shown below.

"Composition of the coating liquid 6"

| Functional material: polydioctylfluorene (PDF) | 700 mg |
| Solvent: diphenylmethane (boiling point 264.5° C.) | 90 ml |
| m-xylene (boiling point 139.3° C.) | 10 ml |

Reference Embodiment 2

A film was formed by performing application in the same manner as in Embodiment 1, except that a coating liquid for organic EL (coating liquid 7) containing, as a mixed solvent, diphenylmethane:m-xylene=96:4 (ratio by volume before mixing) was used. Composition of the coating liquid 7 was shown below.

"Composition of the coating liquid 7"

| Functional material: polydioctylfluorene (PDF) | 700 mg |
| Solvent: diphenylmethane (boiling point 264.5° C.) | 96 ml |
| m-xylene (boiling point 139.3° C.) | 4 ml |

Reference Embodiment 3

A film was formed by performing application in the same manner as in Embodiment 1, except that a coating liquid for organic EL (coating liquid 8) containing, as a mixed solvent, diphenylmethane: m-xylene=95:5 (ratio by volume before mixing) was used. Composition of the coating liquid 8 was shown below.

"Composition of the coating liquid 8"

| Functional material: polydioctylfluorene (PDF) | 700 mg |
| Solvent: diphenylmethane (boiling point 264.5° C.) | 95 ml |
| m-xylene (boiling point 139.3° C.) | 5 ml |

Reference Embodiment 4

A film was formed by performing application in the same manner as in Embodiment 1, except that a coating liquid for organic EL (coating liquid 9) containing, as a mixed solvent, diphenylmethane: m-xylene=10:90 (ratio by volume before mixing) was used. Composition of the coating liquid 9 was shown below.

"Composition of the coating liquid 9"

| Functional material: polydioctylfluorene (PDF) | 700 mg |
| Solvent: diphenylmethane (boiling point 264.5° C.) | 10 ml |
| m-xylene (boiling point 139.3° C.) | 90 ml |

Reference Embodiment 5

A film was formed by performing application in the same manner as in Embodiment 1, except that a coating liquid for organic EL (coating liquid 10) containing, as a mixed solvent, diphenylmethane:m-xylene=30:70 (ratio by volume before mixing) was used. Composition of the coating liquid 10 was shown below.

"Composition of the coating liquid 10"

| Functional material: polydioctylfluorene (PDF) | 700 mg |
| Solvent: diphenylmethane (boiling point 264.5° C.) | 30 ml |
| m-xylene (boiling point 139.3° C.) | 70 ml |

Reference Embodiment 6

A film was formed by performing application in the same manner as in Embodiment 1, except that a coating liquid for organic EL (coating liquid 11) containing, as a mixed solvent, diphenylmethane: toluene (the another solvent)=60:40 (ratio by volume before mixing) was used. Composition of the coating liquid 11 was shown below.

"Composition of the coating liquid 11"

| Functional material: polydioctylfluorene (PDF) | 700 mg |
|---|---|
| Solvent: diphenylmethane (boiling point 264.5° C.) | 60 ml |
| toluene (boiling point 110.6° C.) | 40 ml |

(Evaluation Test)

Using the coating liquids 1 to 11 obtained in Embodiments 1 to 3, Comparative Embodiments 1 and 2, and Reference Embodiments 1 to 6, ejection tests with an ink jet equipment were performed. The following Table 1 shows the results. In evaluation standard of the ejection test, the coating liquid not causing ejection defects after 1000 times is represented by "good". The coating liquid causing ejection defects before 1000 times is represented by "bad". In Embodiments 1 to 3, Comparative Embodiments 1 and 2, and Reference Embodiments 1 to 6, films obtained using a head in which an amount ejected in one ejection was 8 pl were measured for film thickness profile by a step-measuring equipment. The film thickness was measured at 20 points, at 5 mm intervals. difference in film thickness between the thickest point and the thinnest point (film thickness at the thickest point/film thickness at the thinnest point) was determined as flatness. The following Table 1 shows the results.

2 shows that clogging is generated if tetralin having a boiling point less than 250° C. was used instead of diphenylmethane. In contrast, if the head in which the amount ejected in one ejection was 20 pl was used, the ejection was performed well in all Embodiments and Comparative Embodiments, regardless of the composition of the solvents.

It can be judged in the film thickness measurement that the flatness inside the pixel and on the whole of the films is particularly good if the ratio of the film thickness at the thickest point to the film thickness at the thinnest point (film thickness at the thickest point/film thickness at the thinnest point) is 1.1 or smaller. As shown in Table 1, if the head in which the amount ejected in one ejection was 8 pl was used, the results of Embodiments 1 to 3 show that the flatness (unevenness in film thickness) was 1.1 or smaller. However, the results in other Embodiments show that the unevenness in film thickness became larger.

Comparison of results among Embodiment 1, Comparative Embodiment 2, and Reference Embodiment 6 shows that the flatness was reduced if tetralin having a boiling point less than 250° C. was used instead of diphenylmethane and toluene having a boiling point less than 130° C. was used instead of m-xylene.

From the above-mentioned results, in Embodiments 1 to 3, sufficient improvement effects in both of the ejection property of the coating liquid and the flatness of the obtained coating film could be obtained and the coating properties of the coating liquid was excellent. In contrast, in Comparative Embodi-

TABLE 1

| | | Solvent | | | Ejection test | | |
|---|---|---|---|---|---|---|---|
| | | Ratio by volume | Boiling point (° C.) | Organic material | 8 pl | 20 pl | Flatness |
| Embodiment 1 | diphenylmethane | 60 | 264.5 | PDF | Good | Good | 1.05 |
| | m-xylene | 40 | 139.3 | | | | |
| Embodiment 2 | diphenylmethane | 70 | 264.5 | PDF | Good | Good | 1.08 |
| | m-xylene | 30 | 139.3 | | | | |
| Embodiment 3 | diphenylmethane | 40 | 264.5 | PDF | Good | Good | 1.10 |
| | m-xylene | 60 | 139.3 | | | | |
| Comparative Embodiment 1 | diphenylmethane | 9 | 264.5 | PDF | Bad | Good | 4.22 |
| | m-xylene | 91 | 139.3 | | | | |
| Comparative Embodiment 2 | tetralin | 60 | 207.6 | PDF | Bad | Good | 3.15 |
| | m-xylene | 40 | 139.3 | | | | |
| Reference Embodiment 1 | diphenylmethane | 90 | 264.5 | PDF | Good | Good | 2.04 |
| | m-xylene | 10 | 139.3 | | | | |
| Reference Embodiment 2 | diphenylmethane | 96 | 264.5 | PDF | Bad | Good | 2.10 |
| | m-xylene | 4 | 139.3 | | | | |
| Reference Embodiment 3 | diphenylmethane | 95 | 264.5 | PDF | Good | Good | 2.10 |
| | m-xylene | 5 | 139.3 | | | | |
| Reference Embodiment 4 | diphenylmethane | 10 | 264.5 | PDF | Good | Good | 4.23 |
| | m-xylene | 90 | 139.3 | | | | |
| Reference Embodiment 5 | diphenylmethane | 30 | 264.5 | PDF | Good | Good | 3.10 |
| | m-xylene | 70 | 139.3 | | | | |
| Reference Embodiment 6 | diphenylmethane | 60 | 264.5 | PDF | Good | Good | 2.02 |
| | toluene | 40 | 110.6 | | | | |

As shown in Table 1, if a head in which the amount ejected in one ejection was 8 pl was used in the ejection test, comparison of the results of Embodiments 1 to 3 and Reference Embodiments 1 and 3 to 6, with the results of Reference Embodiment 2 and Comparative Embodiments 1 and 2 shows that the coating liquid containing 5 to 95% of diphenylmethane (ratio by volume before mixing) causes no clogging at the head of the ink jet equipment, and therefore the ejection can be performed stably. Comparison of the results of Embodiment 1 with the results of Comparative Embodiment ments 1 and 2, excellent results could not be obtained in both of the ejection property of the coating liquid and the flatness of the coating film.

In Reference Embodiments 1 to 3 and 6, improvement effects in the flatness of the coating film could be obtained and the coating properties of the coating liquid were improved, as compared with those in Comparative Embodiments 1 and 2. In Reference Embodiments 1 and 3 to 6, improvement effects in the ejection property of the coating liquid could be obtained and the coating properties of the coating liquid were improved, as compared with those in Comparative Embodiments 1 and 2.

Further, the obtained films were observed with a microscope, the film thickness was large at both sides and coffee stain-like film thickness unevenness was observed in Comparative Embodiments 1 and 2 and Reference Embodiments 2 and 4 to 6. In Reference Embodiments 1 and 3, the film has a projection at the central part.

Figure 2:
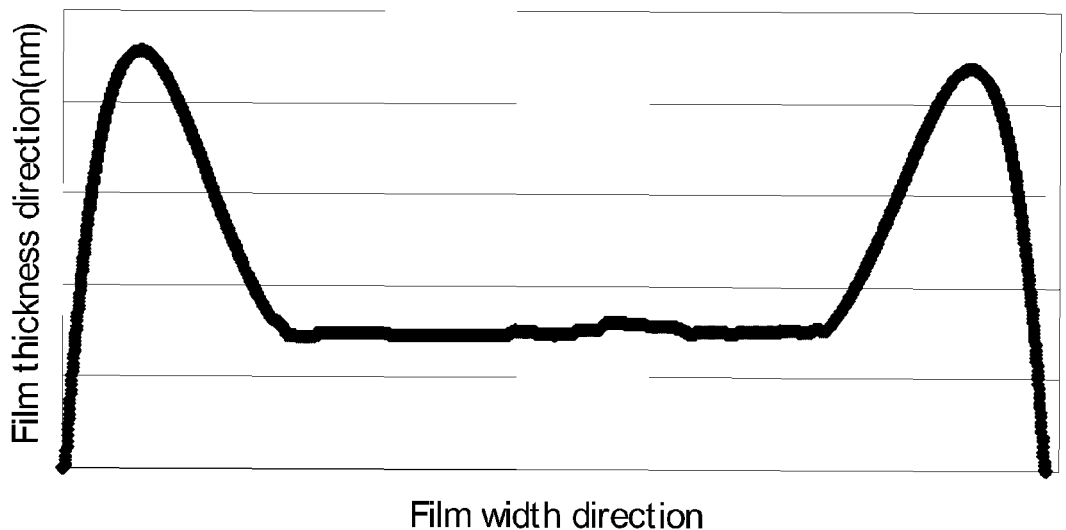
FIG. 2 is a drawing showing a representative example of a film thickness profile of the film obtained using the head in which the amount ejected in one ejection is 8 pl in Comparative Embodiment 2.

The measurement results of the film thickness profile of the films obtained using the head in which the amount ejected in one ejection was 8 pl in Embodiment 1 and Comparative Embodiment 2 were shown in FIGS. 1 and 2. In FIGS. 1 and 2, one scale in the film thickness direction represents 1 nm, and the film width direction is shown on a scale of 1/1000 relative to the film thickness direction.

Embodiment 4

<Production of Organic EL Device>

On a glass substrate with an ITO transparent stripe electrode which was prepared and cleaned by the same method as in Embodiment 1, a mixed aqueous solution containing PEDOT (Polyethylene dioxythiophene) and PPS (Polystylenesulfonic acid) was ejected using an ink jet equipment. Then, the substrate was subjected to heat-drying treatment, and thereby the solvent was removed to form a positive-hole injecting/transporting layer. Then, the coating liquid 1 was prepared and ejected on the positive-hole injecting/transporting layer using an ink jet equipment having a head in which an amount ejected in one ejection was 8 pl. The substrate on which the coating liquid 1 was ejected was dried under reduced pressure for 60 minutes at a room temperature (25° C.) and then subjected to heat treatment at 200° C. for 60 minutes to form a luminescent layer (film). On this luminescent layer, a shadow mask was fixed in a direction perpendicular to the ITO transparent stripe electrode. Then, vacuum deposition of Ca and Al was performed so as to have a thickness of 5 nm and 100 nm, respectively, inside a vacuum deposition equipment. As a result, a bottom emission type organic EL device (functional device) was produced.

Comparative Embodiment 3

An organic EL device was produced by performing application in the same manner as in Embodiment 4, except that the coating liquid 5 was used instead of the coating liquid 1.

Reference Embodiment 7

An organic EL device was produced by performing application in the same manner as in Embodiment 4, except that the coating liquid 9 was used instead of the coating liquid 1.

Reference Embodiment 8

An organic EL device was produced by performing application in the same manner as in Embodiment 4, except that the coating liquid 10 was used instead of the coating liquid 1.

Reference Embodiment 9

An organic EL device was produced by performing application in the same manner as in Embodiment 4, except that the coating liquid 11 was used instead of the coating liquid 1.

The organic EL devices produced in Embodiment 4, Comparative Embodiment 3, and Reference Embodiments 7 to 9 were subjected to luminance unevenness examination. The following Table 2 shows the results. In evaluation standard of the luminance unevenness examination, the organic EL devices were represented by "Good", "Average", "Bad" in the order of those which show small luminance unevenness when a voltage of 5V was applied thereto.

TABLE 2

| | Solvent | | Organic material | luminance unevenness |
|---|---|---|---|---|
| | | Ratio by volume | | |
| Embodiment 4 | diphenylmethane | 60 | PDF | Good |
| | m-xylene | 40 | | |
| Comparative Embodiment 3 | tetralin | 60 | PDF | Bad |
| | m-xylene | 40 | | |
| Reference Embodiment 7 | diphenylmethane | 10 | PDF | Average |
| | m-xylene | 90 | | |
| Reference Embodiment 8 | diphenylmethane | 30 | PDF | Average |
| | m-xylene | 70 | | |
| Reference Embodiment 9 | diphenylmethane | 60 | PDF | Average |
| | toluene | 40 | | |

As shown in Table 2, the organic EL device uniformly emitted light in Embodiment 4, but the organic EL device in Comparative Embodiment 3 had large luminance unevenness, due to the uneven film.

This application claims priority (under 35 U.S.C. §119(a)) on Japanese Patent Application No. 2004-179773 filed in Japan on Jun. 17, 2004, the entire contents of which are hereby incorporated by reference.

The invention claimed is:

1. A coating liquid comprising a mixed solvent and a functional material, wherein the mixed solvent comprises:
   a first solvent constituted by a compound having two or more aromatic rings and a symmetric structure; and
   another solvent including a compound having an aromatic ring; wherein
   a proportion by volume of the another solvent is 90% or less in the mixed solvent; and
   the first solvent is a liquid at $1.0 \times 10^5$ Pa and 25° C., and has a boiling point of 250° C. or more at $1.0 \times 10^5$ Pa.

2. The coating liquid according to claim 1,
   wherein the proportion by volume of the another solvent is 5% or more in the mixed solvent.

3. The coating liquid according to claim 1,
   wherein the proportion by volume of the another solvent is 30 to 60% in the mixed solvent.

4. The coating liquid according to claim 1,
   wherein the compound constituting the first solvent has a structure with a two-fold rotation axis.

5. The coating liquid according to claim 1,
   wherein the first solvent is constituted by at least one compound selected from the group consisting of diphenyl sulfide, diphenylmethane, diphenyl ether, diphenylethylene, dibenzyl ether, and diphenylacetone.

6. The coating liquid according to claim 1,
   wherein the another solvent has a boiling point of 130° C. or more and less than the boiling point of the first solvent at $1.0 \times 10^5$ Pa.

7. A film production method comprising a step of forming a film by performing pattern application of the coating liquid of claim 1.

8. The film production method according to claim 7, wherein the pattern application of the coating liquid is performed using an ejection equipment.

9. The film production method according to claim 8, wherein the ejection equipment is an ink jet equipment.

10. The film production method according to claim 8, wherein an amount ejected in one ejection from a nozzle head of the ejection equipment is more than 0 and 10 pl or less.

11. The film production method according to claim 7, comprising a step of forming a film by applying the coating liquid and treating the coating liquid by air drying, heating, pressurization, reduced pressure, or a combination thereof.

12. A production method of a functional device, comprising a step of forming a film by the film production method of claim 7.

* * * * *